(12) United States Patent
DeNatale et al.

(10) Patent No.: US 8,742,308 B2
(45) Date of Patent: Jun. 3, 2014

(54) IMAGING ARRAY DEVICE STRUCTURE WITH SEPARATE CHARGE STORAGE CAPACITOR LAYER

(75) Inventors: Jeffrey F. DeNatale, Thousand Oaks, CA (US); David J. Gulbransen, Thousand Oaks, CA (US); William E. Tennant, Thousand Oaks, CA (US); Alexandros P. Papavasiliou, Thousand Oaks, CA (US)

(73) Assignee: Teledyne Scientific & Imaging, LLC, Thousand Oaks, CA (US)

(*) Notice: Subject to any disclaimer, the term of this patent is extended or adjusted under 35 U.S.C. 154(b) by 386 days.

(21) Appl. No.: 12/968,811

(22) Filed: Dec. 15, 2010

(65) Prior Publication Data

US 2012/0153122 A1    Jun. 21, 2012

(51) Int. Cl.
*H01L 27/00* (2006.01)
*G05D 23/20* (2006.01)
*G01J 1/46* (2006.01)

(52) U.S. Cl.
CPC .............. *G05D 23/2036* (2013.01); *G01J 1/46* (2013.01)
USPC .................. 250/208.1; 250/214 DC; 257/431

(58) Field of Classification Search
CPC ............ H04N 5/3559; H04N 5/37452; G05D 23/2036; G01J 1/46
USPC ................ 250/208.1, 214.1, 214 R, 214 DC; 257/431, 432, 434
See application file for complete search history.

(56) References Cited

U.S. PATENT DOCUMENTS

| | | | |
|---|---|---|---|
| 5,329,112 A | 7/1994 | Mihara | 250/208.1 |
| 6,906,905 B1 * | 6/2005 | Chinthakindi | 361/277 |
| 7,349,015 B2 | 3/2008 | Harada et al. | 348/243 |
| 7,515,186 B2 | 4/2009 | Moini et al. | 348/294 |
| 8,395,102 B2 * | 3/2013 | Ogawa et al. | 250/214 R |
| 2003/0127598 A1 * | 7/2003 | Sato et al. | 250/370.01 |
| 2007/0285544 A1 * | 12/2007 | Yamada et al. | 348/294 |
| 2008/0042046 A1 * | 2/2008 | Mabuchi | 250/208.1 |

* cited by examiner

*Primary Examiner* — Francis M Legasse, Jr.
(74) *Attorney, Agent, or Firm* — Koppel, Patrick, Heybl & Philpott

(57) ABSTRACT

An imaging array comprises a photodetector layer, a readout IC (ROIC) layer, and a charge storage capacitor layer which is distinct from the photodetector and ROIC layers; the layers are electrically interconnected to form the array. The capacitors within the charge storage capacitor layer are preferably micromachined; the charge storage capacitor layer can be an interposer layer or an outer layer.

33 Claims, 7 Drawing Sheets

IMAGING ARRAY DEVICE STRUCTURE WITH SEPARATE CHARGE STORAGE CAPACITOR LAYER

FIELD OF THE INVENTION

This invention relates generally to imaging arrays, and more particularly to structures and fabrication methods suitable for large-area high-density imaging arrays.

BACKGROUND

A conventional imaging array comprises an array of pixels, each of which includes a photodetector and the input circuit of a "readout IC" (ROIC) which contains both a capacitor which stores the charge generated by the photodetector in response to light, and electrical circuitry to convey the charge from the photodiode to the capacitor and from the capacitor to further processing circuitry of the ROIC. The ROIC and charge storage capacitors are typically fabricated together using an electronic circuit process, such as CMOS, with the size of each charge storage capacitor limited in part by the size of each pixel and the complexity of the circuit.

Problems may arise when a high-density imaging array is needed. A higher density array requires that the pixel size be small. However, a significant limitation is encountered when attempting to scale to smaller pixel size, in that a smaller pixel necessitates a smaller charge storage capacitor, which serves to reduce the amount of charge that can be stored. This has an adverse effect on the array's sensitivity, typically reflected in the "noise equivalent differential temperature" (NEDT) value, which is a measure of the lowest signal flux level that can be detected by the array. The NEDT value might be lowered by making the charge storage capacitors larger, but this would consume circuit area that might otherwise be used to increase circuit functionality. These factors combine to impede the realization of high performance (low NEDT), high-functionality imaging arrays with small pixel pitch.

SUMMARY OF THE INVENTION

An imaging array with a separate charge storage capacitor layer is presented which overcomes the problems noted above, enabling the fabrication of large format, small pixel imaging arrays with high sensitivity.

The present imaging array comprises a photodetector layer, a ROIC layer, and a charge storage capacitor layer which is distinct from the photodetector and ROIC layers; the layers are electrically interconnected to form the array. The capacitors within the charge storage capacitor layer are preferably micromachined; a vertical capacitor comprising a microstructured surface coated with sequential conductive-insulating-conductive thin-film coatings is preferred.

The layers of the array are preferably parallel to and aligned vertically with each other. In one embodiment, the charge storage capacitor layer is an interposer layer positioned between the photodetector and ROIC layers and electrically connected to the ROIC layer; the interposer layer would typically include at least one via arranged to enable a signal to be conveyed between the photodetector and ROIC layers. Alternatively, the charge storage capacitor layer can be an outer layer, typically positioned below the photodetector and ROIC layers and electrically connected to the ROIC layer.

The layers of the array are preferably physically distinct from each other, with an interconnection means provided to electrically interconnect the layers as needed to form the array. This enables the charge storage capacitor, detector, and ROIC layers to be fabricated separately. Alternatively, the detector layer may be fabricated as part of the ROIC layer.

These and other features, aspects, and advantages of the present invention will become better understood with reference to the following drawings, description, and claims.

BRIEF DESCRIPTION OF THE DRAWINGS

The detailed description of embodiments of the invention will be made with reference to the accompanying drawings, wherein like numerals designate corresponding parts in the figures.

DETAILED DESCRIPTION OF THE INVENTION

The present imaging array comprises a photodetector layer, an ROIC layer, and a charge storage capacitor layer which is distinct from the photodetector and ROIC layers. The layers are electrically interconnected to form an imaging array. Making the charge storage capacitor layer distinct from the photodetector and ROIC layers facilitates increasing the amount of capacitance that can be provided in a given area. This also enables each of the layers to be fabricated separately, using process steps best-suited to each, which can potentially improve device yield.

Figure 1A:
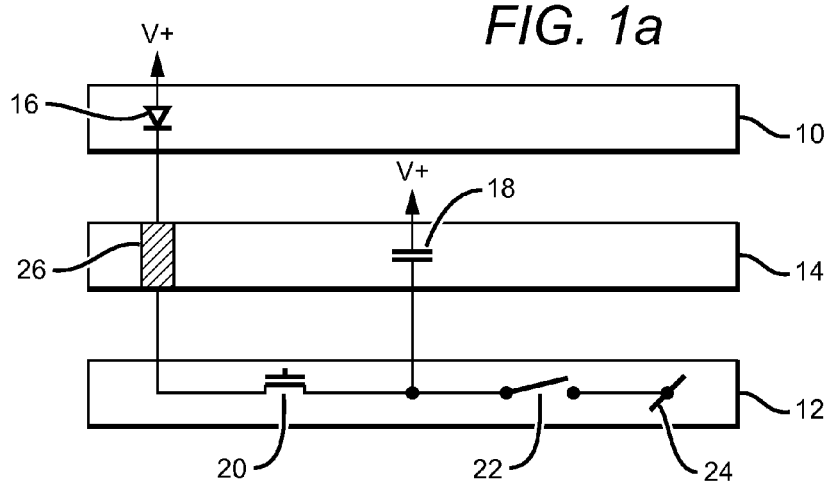
FIGS. 1a and 1b are simplified sectional views of two possible structures for an imaging array per the present invention.
Figure 1B:
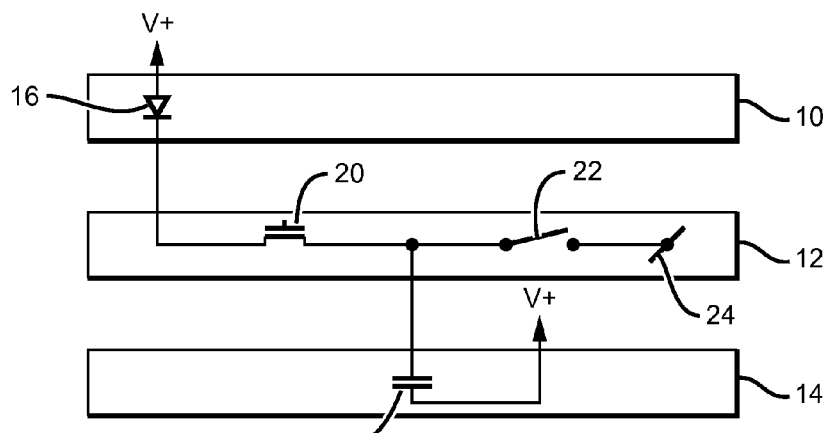

Simplified sectional views of two possible imaging array configurations are shown in FIGS. 1a and 1b. Each configuration includes a photodetector layer 10, an ROIC layer 12, and a charge storage capacitor layer 14. Photodetector layer 10 would typically comprise numerous photodiodes 16, charge storage capacitor layer 14 would typically comprise numerous capacitors 18, and ROIC layer 12 would typically comprise a metering circuit—preferably a direct injection transistor 20—between each photodiode and charge storage capacitor, and a switch 22 between each charge storage capacitor and a pixel column busline 24; each pixel of the array would typically include one of each of these components. In FIG. 1a, charge storage capacitor layer 14 is an interposer layer positioned between photodetector layer 10 and ROIC layer 12, and is electrically connected to the ROIC layer. In this configuration, a through-wafer via 26 would typically be formed through charge storage capacitor layer 14 to convey the signal generated by photodiode 16 to ROIC layer 12. While a simple direct injection-style input circuit is shown here, any of the variety of input circuits that are commonly used in ROIC applications—such as a source follower per detector (SFD), buffered direct injection (BDI), or charge transimpedance amplifier (CTIA)—could also be employed.

An alternative configuration is shown in FIG. 1b. Here, charge storage capacitor layer 14 is an outer layer, positioned below photodetector layer 10 and ROIC layer 12 and electrically connected to the ROIC layer. One advantage of this configuration is that, with the ROIC layer directly below the photodetector layer, the need for a via through charge storage capacitor layer 14 is eliminated.

Figure 2A:
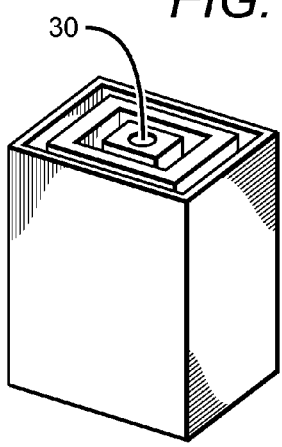
FIG. 2a is a perspective view of a micromachined capacitor for a single pixel cell as might be used with an imaging array per the present invention.
Figure 2B:
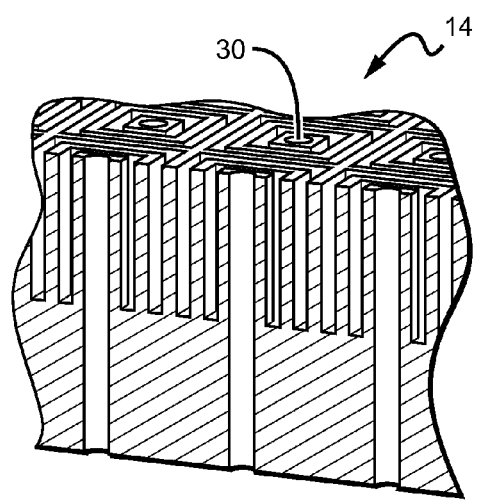
FIG. 2b is a perspective view of an array of micromachined capacitors as might be used with an imaging array per the present invention.

The capacitors in the charge storage capacitor layer are preferably micromachined; a vertical capacitor comprising a base material having a microstructured surface coated with sequential conductive-insulating-conductive thin films is preferred. An exemplary embodiment of such a capacitor is shown in FIG. 2a for a single pixel cell. This capacitor is preferably etched into the base material layer, with the metal-insulating-metal coatings sequentially deposited on the etched surfaces to form the capacitor. Multiple capacitor layers could be stacked and bonded together in tandem to increase the unit cell capacitance without increasing area, should that be desired. A via 30 could be provided through the center of each capacitor if charge storage capacitor layer 14 is an interposer layer and conductive paths through the layer are needed. Charge storage capacitor layer 14 would typically comprise an array of micromachined capacitors, as illustrated in FIG. 2b. Micromachined capacitors of this sort are preferred as they provide more capacitance per unit area than conventional planar capacitors by using the vertical direction to add surface area without increasing the lateral size of the ROIC or detector, as well as by the use of thin and high electrical permittivity dielectrics potentially incompatible with the ROIC process, thereby enabling the array's NEDT value to be lower than it would be otherwise. This capability makes the present array structure particularly well-suited for infrared imaging array applications. Through-wafer vias and micromachined capacitors suitable for use with the present imaging array are described, for example, in co-pending patent application Ser. Nos. 11/800,098, 12/217,217, 12/291, 263 and TBD (from not-yet-filed 2008-170), all of which have been assigned to the present assignee.

The detector, charge storage capacitor, and ROIC layers are preferably parallel to and aligned vertically with each other, with an interconnection means provided to electrically interconnect the layers as needed to form an imaging array. The interconnections between layers can be effected with, for example, solder bumps, indium columns, or metal-metal thermocompression bonding, as well as other methods known to those familiar with IC interconnection techniques. Any of these interconnection means may also serve as a means of bonding the layers together mechanically.

An imaging array as described herein provides a number of advantages. Conventionally, an array's charge storage capacitors are fabricated along with its ROIC circuitry. Here, however, the charge storage capacitor, detector and ROIC layers of the present array may be physically distinct from each other, which enables them to be fabricated separately. This allows the layers to be screened separately and before being assembled into an imaging array, thereby improving yield. This modular approach also enables changes to any of the ROIC, detector or capacitor layers to be easily accommodated. Furthermore, this approach allows the use of processes which are suited to each of the separate detector, ROIC, or capacitor technologies, but which may be incompatible with the technologies of the other layers. Note that it is not essential that the detector and ROIC layers be fabricated separately; the detector layer may alternatively be fabricated as part of the ROIC layer.

Also note that removing the charge storage capacitors from the ROIC as described herein frees up circuit area on the ROIC layer that can be used to enhance circuit functionality. In addition, fabricating micromachined capacitors on a dedicated charge storage capacitor layer makes it possible to make the pixels very small, thereby enabling the production of large-area high-density arrays. A very small pixel size may also enable imaging through scattering media such as dust and sand. The increase in capacitance per unit area can also serve to increase the array's sensitivity.

The photodetector layer suitably comprises a compound or alloy which includes Hg, Zn, Cd, Mn, S, Se and Te, a compound or alloy selected from a group which includes Pb, Sn, S, Se and Te, or a compound or alloy selected from a group which includes Al, Ga, In, Tl, N, As, Sb, Bi, or a compound or alloy selected from a group which includes C, Si and Ge, and superlattice structured materials. The charge storage capacitor layer suitably comprises a silicon base material with selected thin film coatings, and the ROIC layer is suitably a Si-based circuit, such as a CMOS circuit.

Although undoped or lightly doped silicon will be the preferred base material for many applications, for some applications it may be desirable for the charge storage capacitor layer's base material to be highly conductive, such as a metal or heavily doped conducting semiconductor, to act both as the base material and as the first conducting layer of the metal-insulating-metal capacitor. This may provide some advantage in process simplification and capacitor density.

For some applications it may be sufficient for the micromachined layer to be a highly-doped semiconductor and the capacitor to be that of the depletion region of a Schottky-barrier diode deposited on the semiconductor, in which case the capacitor can be formed with a single deposition of the Schottky barrier metal on the micromachined layer.

The present imaging array is suitably formed by fabricating the photodetector, ROIC, and charge storage capacitor layers separately, and then electrically interconnecting the layers. Fabricating the charge storage capacitor layer preferably comprises fabricating a plurality of micromachined vertical capacitors, each of which comprises a microstructured surface coated with sequential conductive-insulating-conductive thin-film coatings.

Figure 3A:
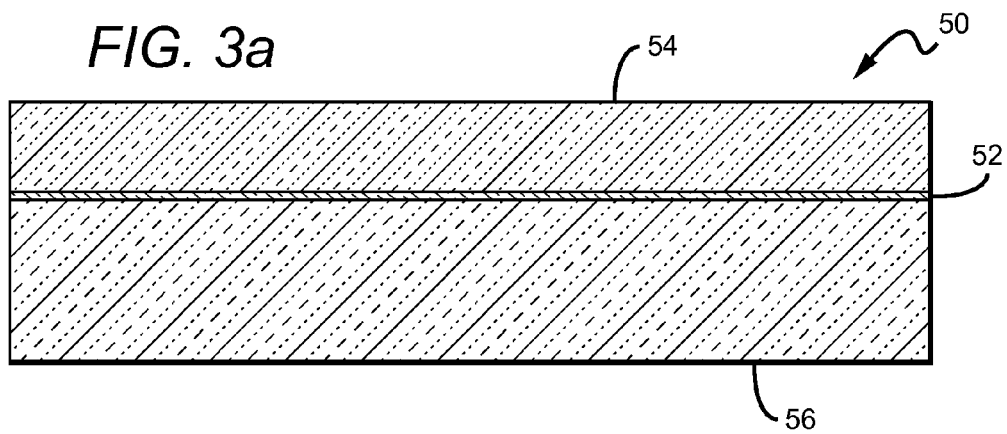
FIGS. 3a-3r are cross-sectional views illustrating the fabrication of an imaging array per the present invention for the configuration of FIG. 1a in which the charge storage capacitor layer is an interposer layer between the photodetector layer and ROIC.
Figure 3B:
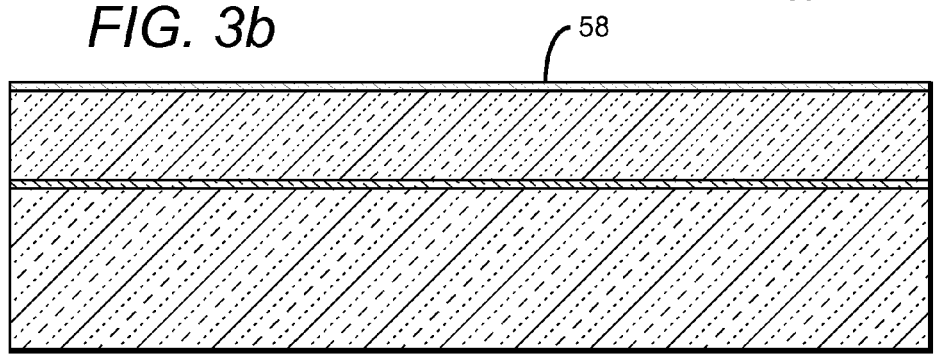
Figure 3C:
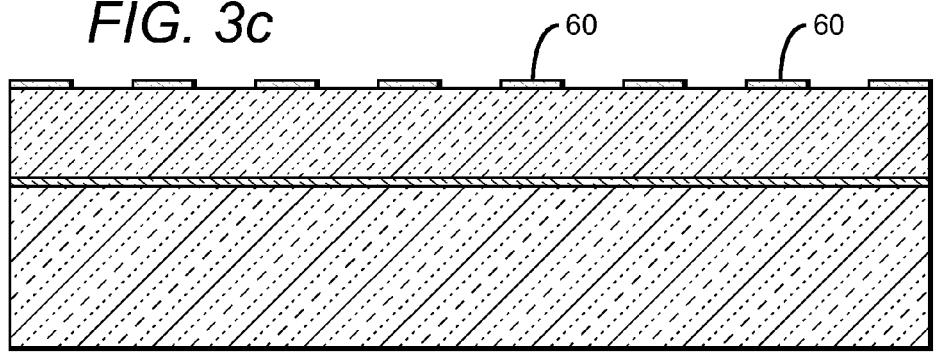
Figure 3D:
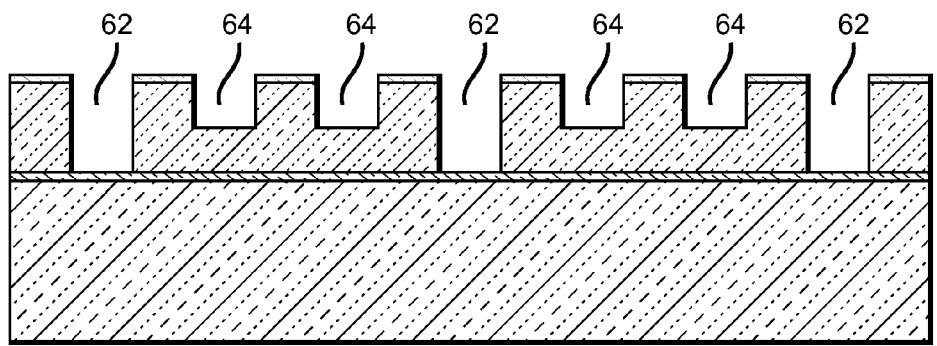
Figure 3E:
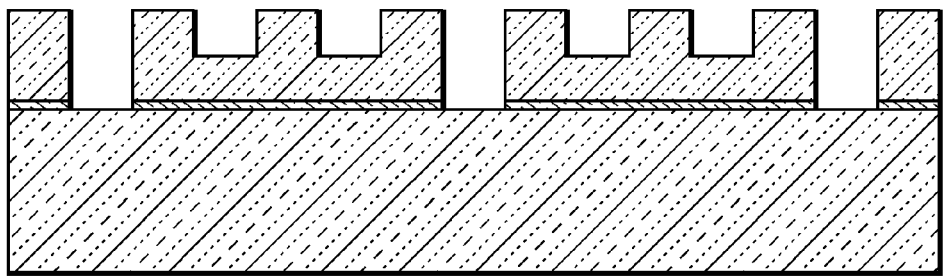
Figure 3F:
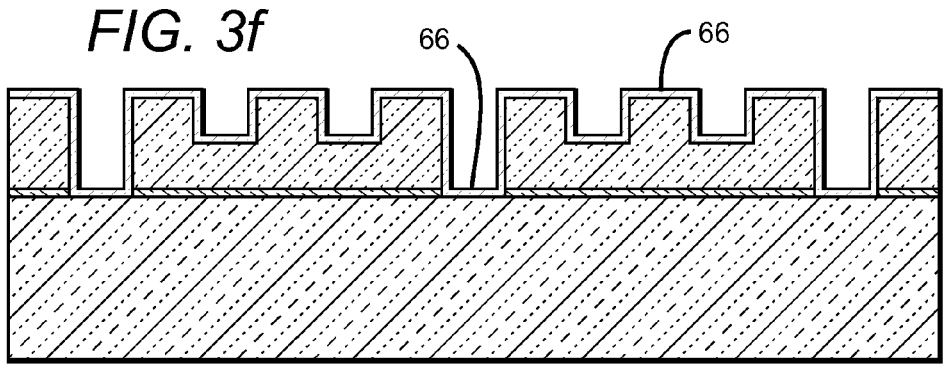
Figure 3G:
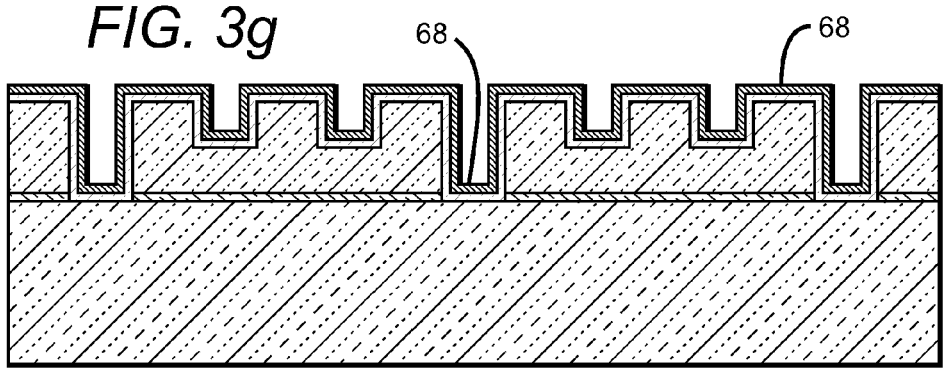
Figure 3H:
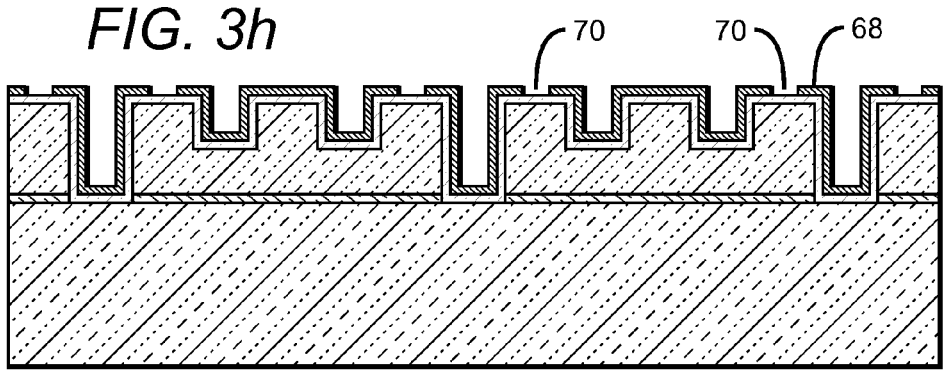
Figure 3I:
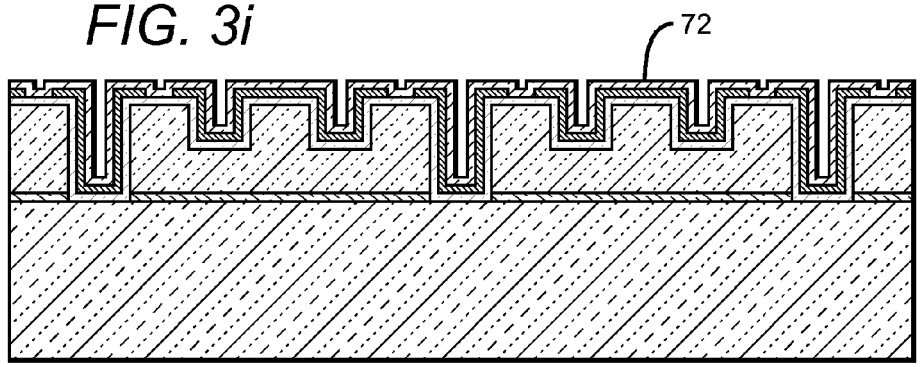
Figure 3J:
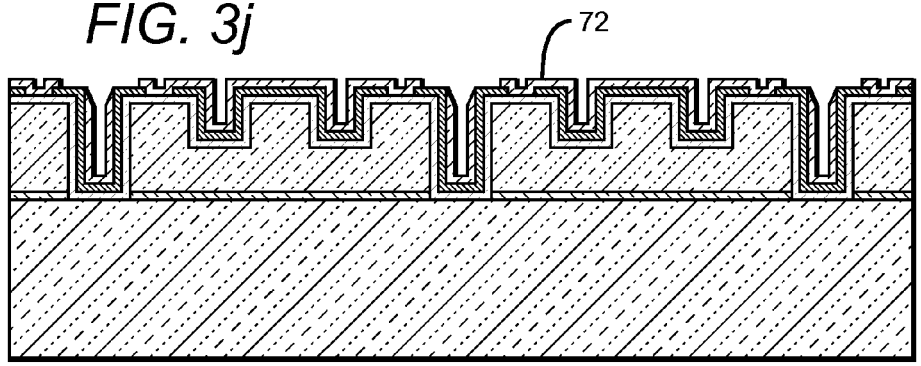
Figure 3K:
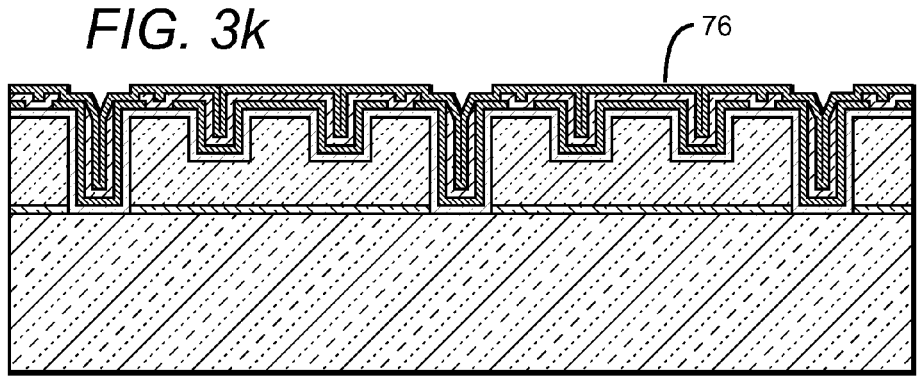
Figure 3L:
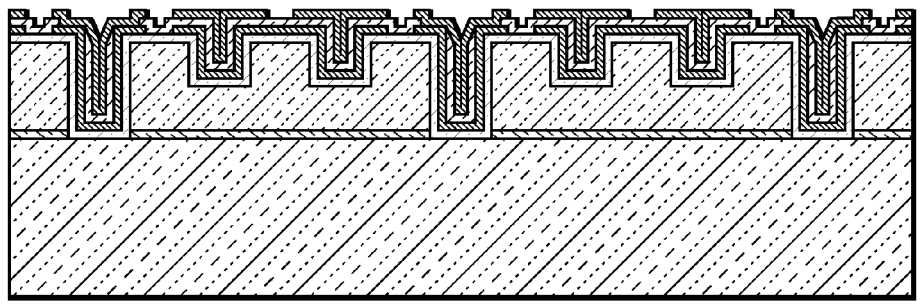
Figure 3M:
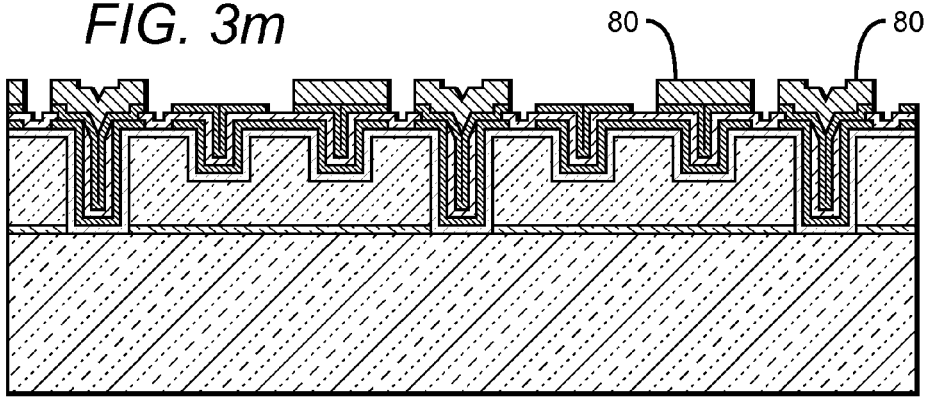
Figure 3N:
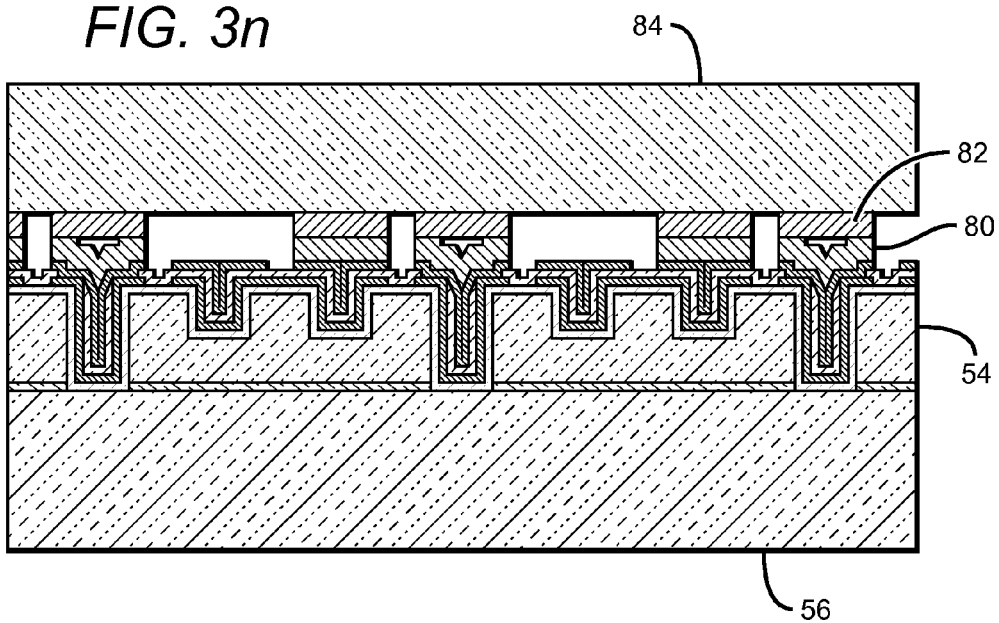
Figure 3O:
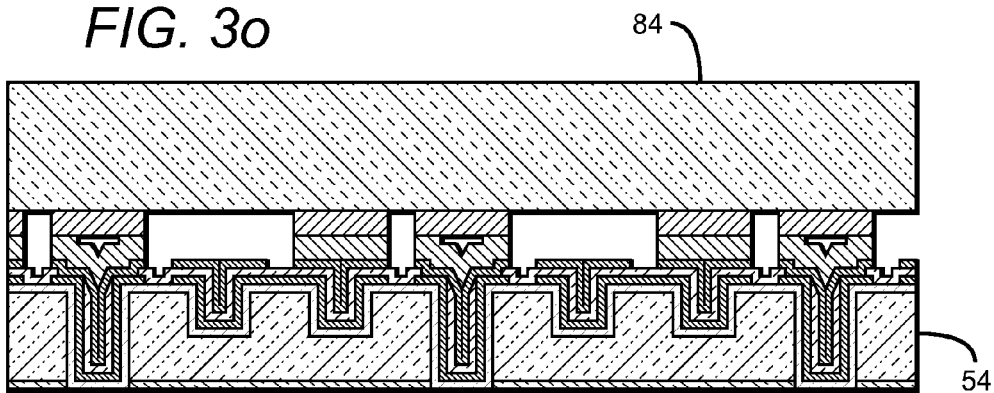
Figure 3P:
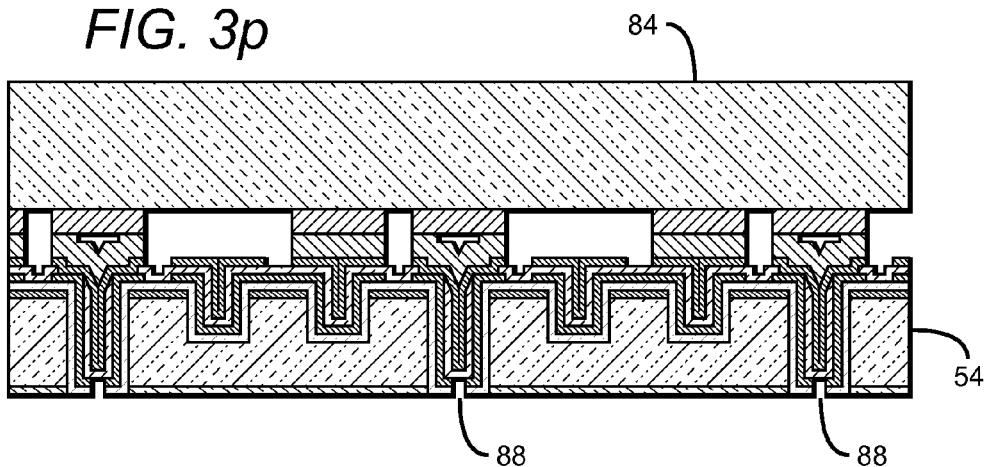
Figure 3Q:
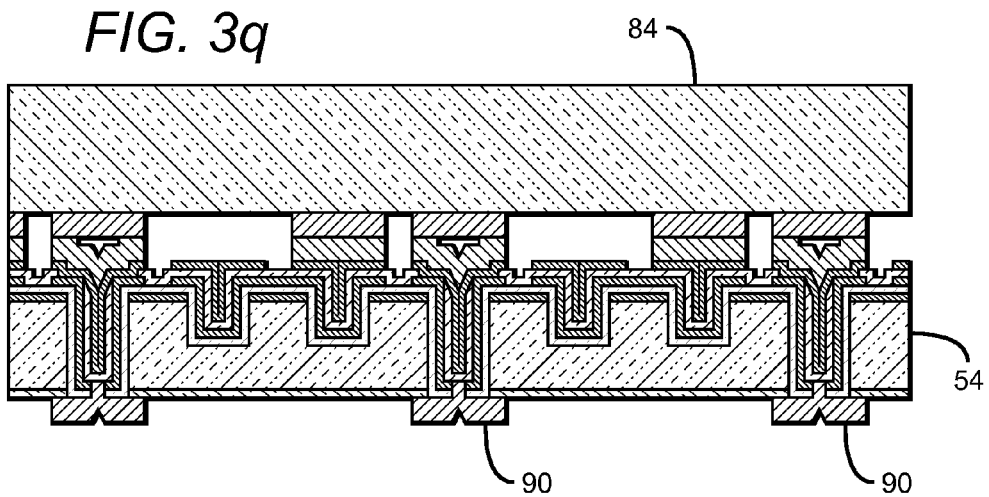
Figure 3R:
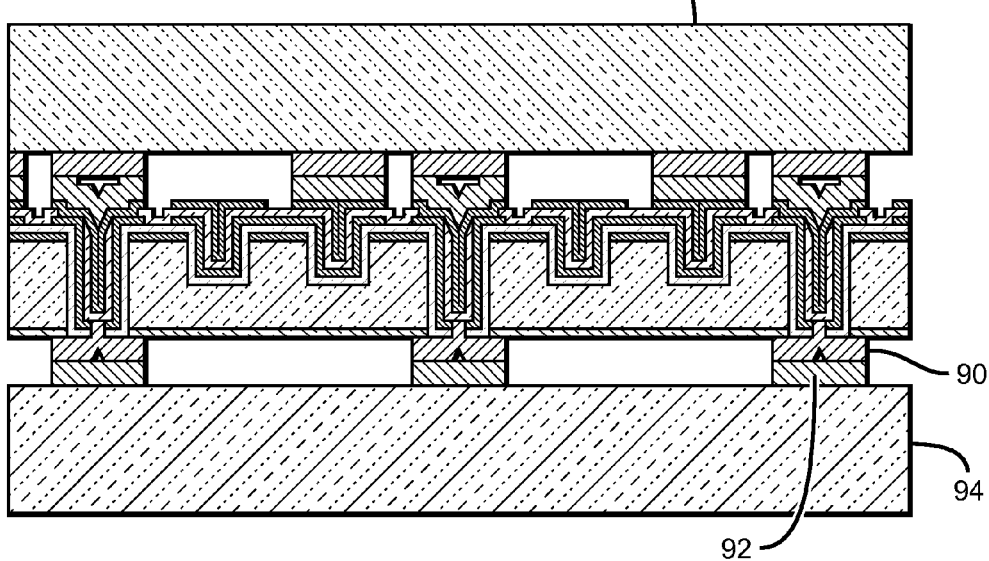

One possible sequence of process steps that might be employed to form an imaging array as described herein is shown in FIGS. 3a-3r, which depict the detailed steps required to form the charge storage capacitor layer, which in this embodiment is an interposer layer. As shown in FIG. 3a, the charge storage capacitor layer preferably begins as a silicon-on-insulator (SOI) substrate 50, in which the portion above the insulator 52 will serve as a device layer 54, and the portion below the insulator will serve as a handle layer 56.

In FIG. 3b, a layer of oxide 58 is grown on device layer 54, which is patterned and etched to provide the periodic oxide areas 60 shown in FIG. 3c. The areas between oxide areas 60 are patterned and etched as shown in FIG. 3d, to form cavities which, with subsequent processing, will become through-wafer vias (62) and vertical capacitors (64). The cavities are preferably formed by dry etching, preferably using a deep reactive ion etching process ("DRIE") such as a time-sequenced etch/passivation chemistry well known to those skilled in the art of MEMS and semiconductor processing. The oxide in areas 60 is removed in FIG. 3e, and a new oxide layer 66 is grown over the entire device layer surface in FIG. 3f.

In FIG. 3g, a first coating layer of a conductive material 68 is deposited over oxide layer 66, including within the via and capacitor openings. Gaps 70 are formed in conductive material layer 68 in FIG. 3h, for the purpose of providing electrical isolation between capacitors and vias. This is followed by the deposition of an insulator coating layer 72 over the top surface, including within the via and capacitor openings (FIG. 3i).

Insulator coating layer 72 is patterned and etched as shown in FIG. 3j, for the purpose of exposing the metal coating in the via region. Then, in FIG. 3k, a second conductive material coating layer 76 is deposited over the top surface, including within the via and capacitor openings. Unneeded portions of conductive material coating layer 76 are removed in FIG. 3l, and contacts 80 for providing electrical connections to the through-wafer vias and capacitors, and to a separate ROIC layer, are formed in FIG. 3m. As noted above, contacts 80 can take the form of, for example, pin-in-socket interconnects, solder bumps, indium columns, or metal-metal thermocompression bonds. In FIG. 3n, the contacts 82 of an ROIC layer 84 are bonded with those (80) of device layer 54. The handle layer 56 is then removed, resulting in the structure shown in FIG. 3o.

The backside of device layer 54 is now processed for connection to a detector layer. In FIG. 3p, access openings 88 are etched into the bottom side of device layer 54 to provide access to vias 62. Contacts 90 for providing electrical connections to the bottom side of vias 62, and to a separate detector layer, are formed in FIG. 3q, and in FIG. 3r, the contacts 92 of a detector layer 94 are bonded with contacts 90, thereby completing the fabrication of the imaging array structure.

Figure 4:
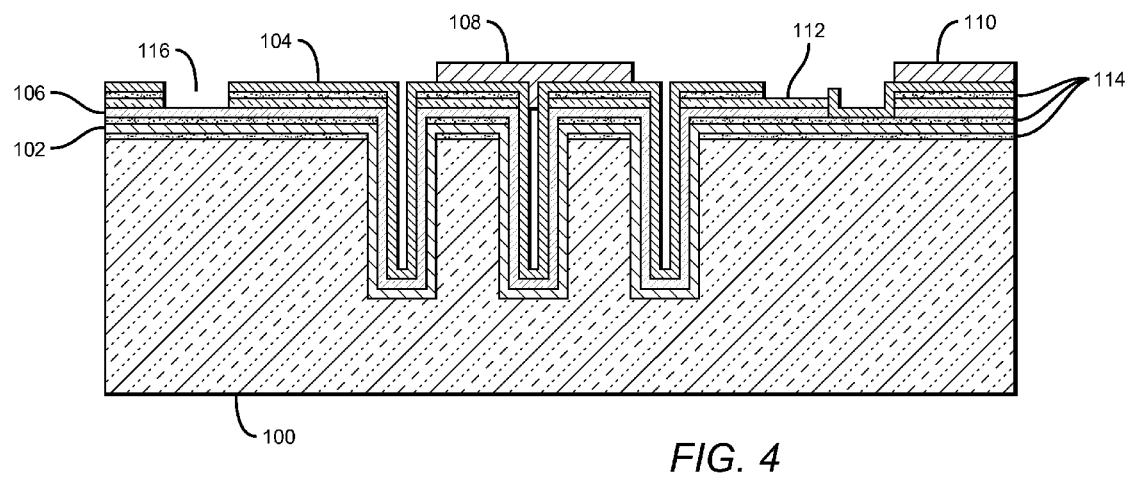
FIG. 4 is a cross-sectional view of a micromachined charge storage capacitor as might be used with an imaging array per the present invention for the configuration of FIG. 1b in which the charge storage capacitor layer is an outermost layer.

A similar set of process steps would be employed if the charge storage capacitor layer is an outer layer instead of an interposer layer, except that no vias would need to be formed through the charge storage capacitor layer. A cross-sectional view of one possible embodiment of such a charge storage capacitor layer is shown in FIG. 4. The capacitor is formed on a silicon substrate 100, and consists of metal layers 102 and 104 separated by a dielectric layer 106. A first 'high' contact 108 provides a conductive path to metal layer 104 and a second 'ground' contact 110 provides a conductive path to metal layer 102; there would typically be one 'high' contact per pixel, and one 'ground' contact per array. The structure preferably also includes insulator 112 and adhesion 114 layers, as well as isolation gaps 116 between adjacent pixels.

The insulator coating is preferably deposited using atomic layer deposition (ALD), such that it is electrically insulating, continuous and substantially conformal. Preferred materials for the insulator layer include oxides of hafnium, tantalum, aluminum, and silicon, both alone and in combinations. The conductive material coatings are also preferably deposited using ALD, such that they are electrically continuous across the length of the through-wafer via and capacitor cavities in which they are deposited. The conductive material is preferably chosen from a group consisting of nickel, palladium, platinum, ruthenium, tungsten, iridium, copper, titanium nitride or zinc oxide. ALD is a gas phase chemical process used to create thin film coatings that are highly conformal and have extremely precise thickness control. The majority of ALD reactions use two chemicals, typically called precursors. These precursors react with a surface one-at-a-time in a sequential manner. By exposing the precursors to the growth surface repeatedly, a thin film is deposited. Additional details about ALD can be found, for example, in "Surface Chemistry for Atomic Layer Growth", S. M. George et al., *J. Phys. Chem.*, Vol. 100, No. 31 (1996), pp. 13121-13131.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:
1. An imaging array, comprising:
a photodetector layer;
a readout integrated circuit (ROIC) layer; and
a charge storage capacitor layer which is distinct from said photodetector and ROIC layers, said layers electrically interconnected to form an imaging array;
wherein said charge storage capacitor layer comprises one or more micromachined capacitors; and
wherein said micromachined capacitors are vertical capacitors, each of which comprises a base material having a microstructured surface coated with sequential conductive-insulating-conductive coating layers.

2. The imaging array of claim 1, wherein said charge storage capacitor layer comprises multiple capacitor layers stacked and bonded together in tandem so as to increase unit cell capacitance without increasing surface area.

3. The imaging array of claim 1, wherein said layers are parallel to and aligned vertically with each other.

4. The imaging array of claim 1, wherein said photodetector layer comprises a compound or alloy which includes Hg, Zn, Cd, Mn, S, Se and Te.

5. The imaging array of claim 1, wherein said photodetector layer comprises a compound or alloy selected or formed from members of a group which includes Pb, Sn, S, Se and Te.

6. The imaging array of claim 1, wherein said photodetector layer is made from a compound or alloy selected or formed from members of a group which includes Al, Ga, In, Tl, N, As, Sb, and Bi.

7. The imaging array of claim 1, wherein said photodetector layer is made from a compound or alloy selected or formed from members of a group which includes C, Si and Ge.

8. The imaging array of claim 1, wherein said photodetector layer is made from a compound or alloy selected or formed from members of a group which includes superlattice structured materials.

9. The imaging array of claim 1, wherein said charge storage capacitor layer comprises a silicon base material coated with insulating and conductive thin films.

10. The imaging array of claim 1, wherein said ROIC layer is a CMOS circuit.

11. The imaging array of claim 1, wherein said charge storage capacitor layer, said detector layer and said ROIC layer are fabricated separately.

12. The imaging array of claim 1, wherein said photodetector layer is fabricated as part of said ROIC layer.

13. The imaging array of claim 3, wherein said charge storage capacitor layer is an interposer layer positioned between said photodetector and ROIC layers and electrically connected to said ROIC layer.

14. The imaging array of claim 13, wherein said interposer layer includes one or more through-wafer vias arranged to enable respective signals to be conveyed between said photodetector layer and said ROIC layer.

15. The imaging array of claim 3, wherein said charge storage capacitor layer is an outer layer positioned below said photodetector and ROIC layers and electrically connected to said ROIC layer.

16. The imaging array of claim 3, wherein said layers are physically distinct from each other, further comprising interconnection means between said layers which electrically interconnect said layers.

17. The imaging array of claim 16, wherein said interconnection means comprise a pin-in-socket arrangement, solder bumps, indium columns, and/or metal-metal thermocompression bonds.

18. An imaging array, comprising:
a photodetector layer;
a readout integrated circuit (ROIC) layer; and
a charge storage capacitor layer which is distinct from said photodetector and ROIC layers, said layers electrically interconnected to form an imaging array;
wherein said charge storage capacitor layer comprises one or more micromachined capacitors; and
wherein said micromachined capacitors are vertical capacitors, each of which comprises a base material having a microstructured surface coated with sequential conductive-insulating-conductive layers, whereby one of the conductive layers is provided by the conductivity of said base material.

19. The imaging array of claim 18, wherein said base material is a metal or a doped semiconductor.

20. A method of forming an imaging array, comprising:
fabricating a photodetector layer;
fabricating a readout integrated circuit (ROIC) layer separately from said detector layer;
fabricating a charge storage capacitor layer separately from said photodetector and ROIC layers; and
electrically interconnecting said layers to form an imaging array;
wherein said step of fabricating a charge storage capacitor layer comprises fabricating one or more micromachined vertical capacitors, each of which comprises a base material having a microstructured surface coated with sequential conductive-insulating-conductive layers.

21. The method of claim 20, whereby one of the conductive layers is provided by the conductivity of said base material.

22. The method of claim 20, further comprising arranging said layers in parallel and aligning them vertically such that they are in a top, middle and bottom configuration, said step of electrically interconnecting said layers comprising providing a first interconnection means between said top and middle layers and providing a second interconnection means between said middle and bottom layers.

23. The method of claim 20, wherein said photodetector layer comprises a compound or alloy which includes Hg, Zn, Cd, Mn, S, Se and Te.

24. The method of claim 20, wherein said photodetector layer comprises a compound or alloy selected or formed from members of a group which includes Pb, Sn, S, Se and Te.

25. The method of claim 20, wherein said photodetector layer is made from a compound or alloy selected or formed from members of a group which includes Al, Ga, In, Tl, N, As, Sb, and Bi.

26. The method of claim 20, wherein said photodetector layer is made from a compound or alloy selected or formed from members of a group which includes C, Si and Ge.

27. The imaging array of claim 20, wherein said photodetector layer is made from a compound or alloy selected or formed from members of a group which includes superlattice structured materials.

28. The method of claim 20, wherein said charge storage capacitor layer comprises silicon.

29. The method of claim 20, wherein said ROIC layer is a CMOS circuit.

30. The method of claim 20, further comprising:
fabricating one or more additional charge storage capacitor layers; and
stacking and bonding said charge storage capacitor layers together in tandem so as to increase unit cell capacitance without increasing surface area.

31. The method of claim 20, wherein said photodetector layer is fabricated as part of said ROIC layer.

32. The method of claim 22, wherein said charge storage capacitor layer is said middle layer, further comprising providing one or more through-wafer vias through said charge storage capacitor layer which enable respective signals to be conveyed between said detector layer and said ROIC layer.

33. The method of claim 22, wherein said charge storage capacitor layer is one of said top or bottom layers.

* * * * *